United States Patent
Feiweier

(10) Patent No.: US 8,111,069 B2
(45) Date of Patent: Feb. 7, 2012

(54) MAGNETIC RESONANCE SYSTEM AND OPERATING METHOD WITH COMPENSATION OF SECOND-ORDER MAXWELL TERMS

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 204 days.

(21) Appl. No.: 12/486,087

(22) Filed: Jun. 17, 2009

(65) Prior Publication Data

US 2009/0309596 A1 Dec. 17, 2009

(30) Foreign Application Priority Data

Jun. 17, 2008 (DE) .................. 10 2008 028 773

(51) Int. Cl.
*G01V 3/00* (2006.01)
(52) U.S. Cl. ...................................... 324/309
(58) Field of Classification Search .......... 324/300–322; 600/410–485
See application file for complete search history.

(56) References Cited

U.S. PATENT DOCUMENTS 6,107,800 A 8/2000 Claasen-Vujcic et al.
6,515,478 B1 2/2003 Wicklow et al.

*Primary Examiner* — Dixomara Vargas
(74) *Attorney, Agent, or Firm* — Schiff Hardin LLP

(57) ABSTRACT

A magnetic resonance system has a basic magnet system that generates a temporally static, spatially homogeneous basic magnetic field in an examination volume of the magnetic resonance system, and a radio-frequency system. An overlay system generates overlay fields in the examination volume that, together with the basic field, form a complete field. The overlay system has at least one first order field system and at least one second order field system. The first order field system generates fields that, to a first approximation, exhibit a spatial dependency of the first order. The second order field system generates fields that, to a first approximation, exhibit a spatial dependency of the second order. A control device operates the radio-frequency system with an operating frequency and controls the first and second order field systems to cause a deviation between the complete field and a desired gradient to exhibit a spatial dependency of the second order and to satisfy a minimum condition within a correction volume.

6 Claims, 2 Drawing Sheets

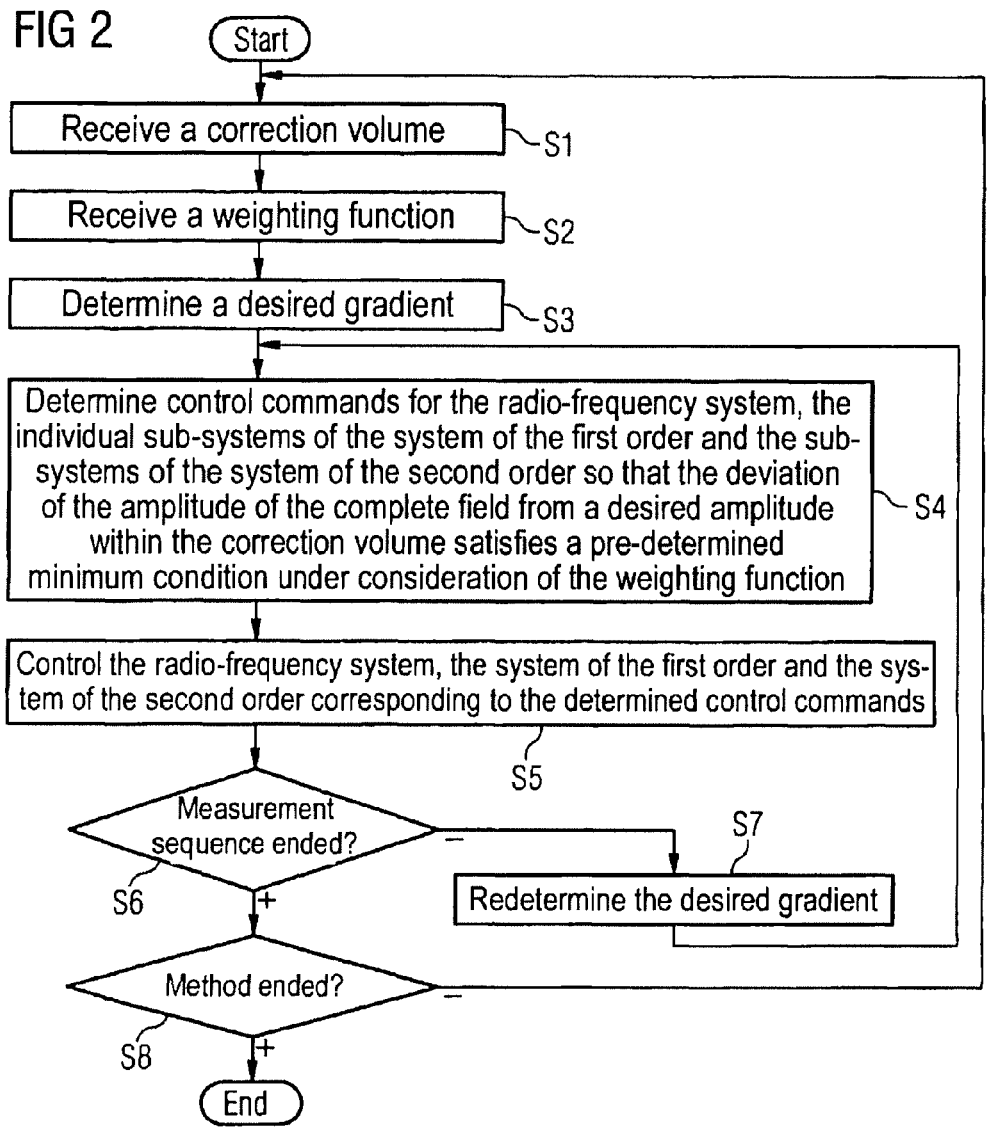
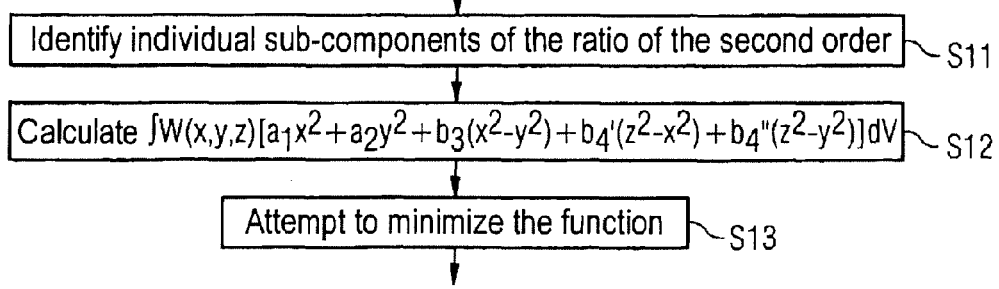

MAGNETIC RESONANCE SYSTEM AND OPERATING METHOD WITH COMPENSATION OF SECOND-ORDER MAXWELL TERMS

BACKGROUND OF THE INVENTION

1. Field of the Invention

The present invention concerns a magnetic resonance system and an operating method therefore, as well as a control device of a magnetic resonance system and a computer-readable medium encoded with programming instructions, the computer-readable medium being loadable into a control device of a magnetic resonance system to operate the magnetic resonance system in accordance with the operating method.

2. Description of the Prior Art

EP 0 850 422 B1, corresponding to U.S. Pat. No. 6,107,800, discloses a method for operating a magnetic resonance system of the type having a basic field magnet system that generates a temporally static, spatially homogeneous basic magnetic field in an examination volume of the magnetic resonance system. This magnetic resonance system has at least one radio-frequency system operable to excite nuclear spins in an examination subject in the examination volume to magnetic resonance, and with which magnetic resonance signals excited in the examination subject can be acquired. This magnetic resonance system also has an overlay system that generates overlay fields in the examination volume so that the basic magnetic field and the overlay fields superimpose to form a complete field. The overlay system includes at least one system of the first order and one system of the second order. The system of the first order is fashioned to generate fields that, in a first approximation, exhibit a spatial dependency of the first order, and the system of the second order is fashioned to generate fields that, in a first approximation, exhibit a spatial dependency of the second order. A desired gradient and a correction volume are provided to a control device of the magnetic resonance system, and the control device operates the at least one radio-frequency system with an operating frequency, and the system of the first order and the system of the second order are controlled such that a deviation of the amplitude of the resulting complete field from a desired amplitude defined by the basic magnetic field and the desired gradient exhibits a spatial dependency of the second order and satisfies a predetermined minimum condition within the correction volume.

EP 0 850 422 B1 also discloses a magnetic resonance system that is operable as described above.

SUMMARY OF THE INVENTION

An object of the present invention is to provide a magnetic resonance system and operating method wherein compensation of Maxwell terms of the second order that is improved compared to known compensation techniques.

This object is achieved by an operating method for a magnetic resonance system wherein, according to the invention, the control device weights the deviation of the amplitude of the complete field from the desired amplitude with a weighting function that is spatially dependent within the correction volume in order to check whether the minimum condition is satisfied.

The weighting function can depend on the examination subject and/or the arrangement of the examination subject in the examination volume.

The system of the first order normally has multiple sub-systems by which respective fields can be generated whose spatial dependency of the component directed parallel to the basic magnetic field defines orthogonal directions in pairs. In some cases, the sub-systems are operated individually. However, cases are also conceivable in which at least two of the sub-systems of the system of the first order are operated simultaneously. In this case, the amplitude of the resulting complete field exhibits a cross-ratio that respectively exhibits a linear spatial dependency in two of the directions orthogonal to one another. The system of the second order can possess at least one sub-system by which a field of the second order can be generated that exhibits the same functional spatial dependency as the aforementioned cross-ratio. If the control device activates at least two of the sub-systems of the second order simultaneously, it is therefore advantageously provided that the control device activates the corresponding sub-system of the system of the second order such that the activation of the corresponding sub-system of the second order entirely compensates for the cross-ratio.

The above object is also achieved in accordance with the invention by a computer-readable medium encoded with program code (programming instructions that, when executed the control device of a magnetic resonance system, cause the control device to operate the magnetic resonance system according to the operating method according to the invention.

The above object also is achieved by control device according to the invention that is configured to operate a magnetic resonance system to the operating method according to the invention. The control device is fashioned as a software-programmable control device that is programmed with programming instructions.

BRIEF DESCRIPTION OF THE DRAWINGS

FIG. 2 is a flow chart showing the basic steps of an embodiment of a method for operating a magnetic resonance system in accordance with the present invention.

FIG. 3 is a flow chart illustrating the basic steps of an embodiment for implementing step S4 of the embodiment of FIG. 2.

DESCRIPTION OF THE PREFERRED EMBODIMENTS

Figure 1:
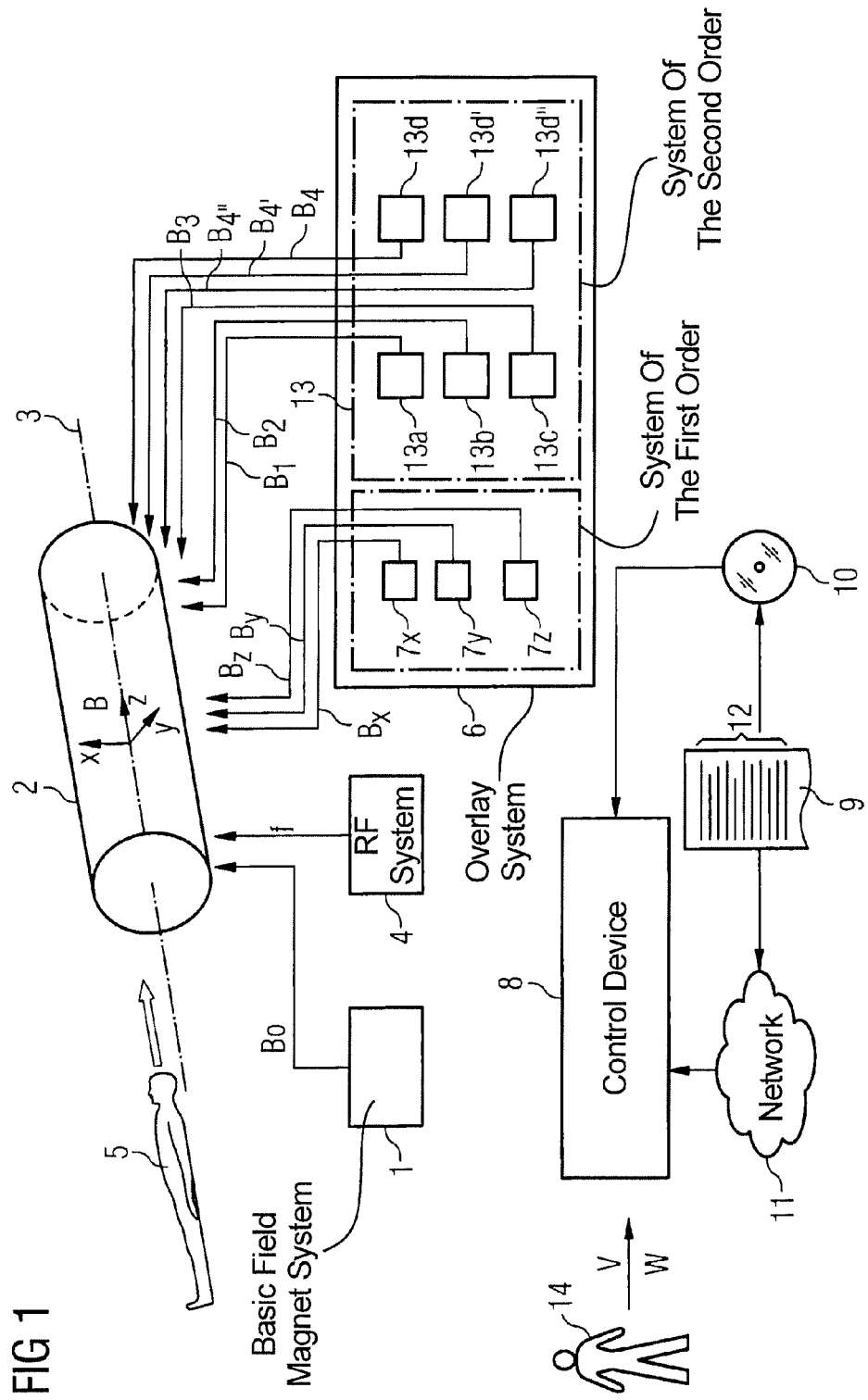
FIG. 1 schematically illustrates a magnetic resonance system constructed and operating in accordance with the present invention.

As shown in FIG. 1, a magnetic resonance system has a basic field magnet system 1. A temporally static, spatially homogeneous basic magnetic field $B_0$ is generated thereby in an examination volume 2 of the magnetic resonance system by means of the basic field magnet system 1.

The basic field magnet system 1 is normally fashioned such that the examination volume 2 is essentially cylindrically symmetrical around an axis of symmetry 3. The basic magnetic field $B_0$ is usually aligned parallel to the axis of symmetry 3.

A coordinate system with coordinate axes with coordinates x, y, z is normally defined both in the prior art and in the present invention. The z-axis hereby aligns with the axis of symmetry 3. It is normally oriented horizontally. The origin of the z-axis lies in the center of the examination volume 2. The x-axis and the y-axis proceed in a plane that is orthogonal to the z-axis and contains the zero point (point of origin) of the z-axis. The x-axis is normally oriented horizontally, the y-axis vertically. The orientation of the individual axes does not necessarily have to be as described.

The magnetic resonance system both in the prior art and in the present invention has at least one radio-frequency (RF) system 4. Nuclear spins in an examination subject 5 arranged in the examination volume 2 can be excited to magnetic resonance of the radio-frequency system 4. Furthermore, magnetic resonance signals resulting from the excited nuclear spins in the examination subject 4 can be acquired (detected) by means of the radio-frequency system 4.

Furthermore, the magnetic resonance system has an overlay system 6. The examination volume 2 can be charged with overlay fields $B_x$, $B_y$, $B_z$, $B_1$, $B_2$, $B_3$, $B_4$, $B_4'$, $B_4''$ by the overlay system 6 so that the basic magnetic field $B_0$ and the overlay fields $B_x$, $B_y$, $B_z$, $B_1$, $B_2$, $B_3$, $B_4$, $B_4'$, $B_4''$ superimpose to form a complete field B.

The overlay system 6, both in the prior art and in the present invention, has a system 7 of the first order. The system 7 of the first order is fashioned such that fields $B_x$, $B_y$, $B_z$ can be generated by it that, to a first approximation, exhibit a spatial dependency of the first order. Such systems of the first order are known in the prior art (what are known as gradient systems). Such a system 7 of the first order normally has multiple (usually three) sub-systems 7x, 7y, 7z. Respective fields $B_x$, $B_y$, $B_z$ that can exhibit a spatial dependency of the first order can be generated by the sub-systems 7x, 7y, 7z. The spatial dependencies of the components of the fields $B_x$, $B_y$, $B_z$ directed parallel to the basic magnetic field $B_0$ define orthogonal directions in pairs. They normally proceed in the direction of the x-axis, the y-axis and z-axis.

The magnetic resonance system furthermore has a control device 8. The control device 8 controls at least the radio-frequency system 4 and the overlay system 6 corresponding to desired measurement sequences. Furthermore, the control device 8 normally receives the magnetic resonance signals acquired by the radio-frequency system 4.

The control device 8 controls the magnetic resonance system so that the magnetic resonance system is operated according to an operating method that is explained in detail in the following. For this purpose, the control device 8 is normally fashioned as a software-programmable control device 8. The control device 8 is thus programmed with a computer program 9. The computer program 9 can be supplied to the control device 8 for this purpose, for example via a data medium 10 on which said computer program 9 is stored in a machine-readable form. The data medium 10 in FIG. 10 is shown as a CD-ROM, but this is only an example. The data medium 10 could likewise be fashioned otherwise, for example as a USB memory stick or as an SD memory card. It would also be possible to supply the computer program 9 to the control device 8 via a network connection 11 (for example the Internet or a LAN).

The computer program 9 according to FIG. 1 embodies machine code 12 that can be directly executed by the control device 8. The execution of the machine code 12 by the control device 8 causes the control device 8 to operate the magnetic resonance system according to the operating method according to the invention.

As mentioned, the basic magnetic field $B_0$ is locally homogeneous, temporally static, and directed parallel to the z-axis. In vector notation, it thus exhibits the form $$B_0(x,y,z)=(0;0;B_0) \tag{1}$$

Ideally, by means of the sub-system 7x it should be possible to generate a field $B_x$ of the first order (gradient field) that exhibits the form $$B_x(x,y,z)=(0,0;G_x x) \tag{2}$$

In an analogous manner, by means of the sub-systems 7y, 7z it should be possible to generate fields $B_y$, $B_z$ which exhibit the form $$B_y(x,y,z)=(0;0;B_y y) \tag{3}$$

$$B_z(x,y,z)=(0;0;B_z z) \tag{4}$$

$G_x$, $G_y$ and $G_z$ are the components of a (vectorial) desired gradient G*. They are proportional to an operating current with which the respective sub-system 7x, 7y, 7z is charged.

However, such magnetic fields are not a solution of the static Maxwell equations $$\text{div}B=0 \text{ and } \text{curl}B=0 \tag{5}$$

The gradient fields are therefore accompanied by additional field components. In the most general case, it hereby applies that $$B_x(x,y,z)=(G_x(z+z_{0x});0;G_x x) \tag{6}$$

$$B_y(x,y,z)=(0;G_y(z+z_{0y});G_y y) \tag{7}$$

$$B_z(x,y,z)=(-\alpha G_z(x+x_0);-(1-\alpha)G_z(y+y_0);G_0 z) \tag{8}$$

$z_{0x}$, $z_{0y}$, $x_0$, $y_0$ and $\alpha$ are constants that are defined by the geometry of the basic magnet system 1 and the sub-systems 7x, 7y, 7z of the system 7 of the first order. For example, for symmetrical coil systems it applies that $$z_{0x}=z_{0y}=x_0=y_0=0 \text{ and} \tag{9}$$

$$\alpha=\tfrac{1}{2} \tag{10}$$

The (local) Larmor frequency is defined by the gyromagnetic ratio of the relevant atomic nuclei and the magnitude of the amplitude A of the complete field B, wherein $$B=B_0+B_x+B_y+B_z \tag{11}$$

The magnitude of the complete field B hereby is the square root of the sum of the square of the individual components of the complete field B.

Although a determination of the magnitude of the total field B is clearly possible, it is complicated (calculating the root). Due to the fact that the gradient fields $B_x$, $B_y$, $B_z$ are significantly smaller than the magnitude of the basic magnetic field $B_0$, however, it is possible and permissible to produce a Taylor series expansion. The amplitude A of the complete field B can also be written as $$A=A_0+A_1+A_2+A_3+\ldots \tag{12}$$

wherein $A_i$ is the ratio of the i-th order.

The ratio of the zeroth order $A_0$ results as $$A_0(x,y,z)=B_0+G_x^2 z_{0x}^2/2B_0+G_y^2 z_{0y}^2/2B_0+\alpha^2 G_z^2 x_0^2/2B_0+(1-\alpha)^2 G_z^2 y_0^2/2B_0-\alpha G_x G_z x_0 z_{0x}/B_0-(1-\alpha)G_y G_z y_0 z_{0y}/B_0 \tag{13}$$

The ratio of the first order $A_1$ results as $$A_1(x,y,z)=G_x x+G_y y+G_z z+G_x^2 zz_{0x}/B_0+G_y^2 zz_{0y}/B_0+\alpha G^2 xx_0/B_0+(1-\alpha)^2 G_z^2 yy_0/B_0-\alpha G_x G_z(xz_{0x}+zx_0)/B_0-(1-\alpha)G_y G_z(yz_{0y}+zy_0)/B_0 \tag{14}$$

The ratio of the second order $A_2$ results as $$A_2(x,y,z)=G_x^2 z^2/2B_0+G_y^2 z^2/2B_0+\alpha^2 G_z^2 x^2/2B_0+(1-\alpha)^2 G_z^2 y^2/2B_0-2\alpha G_x G_z xz/2B_0-2(1-\alpha)G_y G_z yz/2B_0 \tag{15}$$

It is possible and known to design the basic magnet system 1 and the system 7 of the first order such that the above equations (9) and (10) are satisfied. In this case, the equations (13) and (14) simplify as $$A_0(x,y,z)=B_0 \tag{16}$$

$$A_1(x,y,z)=G_x x+G_y y+G_z z \tag{17}$$

The ratio of the zeroth order $A_0$ and the ratio of the first order $A_1$ therefore also correspond without correction to the desired variables. However, even if Equations 9 and 10 are not satisfied (thus in the general case), it is possible to compensate for the occurring deviations of the zeroth and first order from the desired ratios $B_0$ or $G_x x + G_{yy} + G_z z$. The applicable procedures are disclosed in EP 0 850 422 B1. It is thus possible to ensure that the amplitude A of the complete field B corresponds in the zeroth and first approximation with the corresponding desired amplitude $B^*(x,y,z) = B_0 + G_x x + G_y y + G_z z$. A correction of an error of the zeroth order can ensue (in alternation or combination) via switching of an auxiliary coil of the zeroth order and via adaptation of the operating frequency of the radio-frequency system 4.

However, the ratio of the second order is always different than zero, independent of the design of the basic magnet system 1 and the system 7 of the first order.

From U.S. Pat. No. 6,515,478 it is known to provide the auxiliary coil of the zeroth order and to control the auxiliary coil and the system 7 of the first order such that the coordinate origin of the coordinate system is shifted. In other words: a point (x', y', z') is selected and the ratio of the second order $A_2$ is formulated as if the chosen point (x', y', z') were the coordinate origin. This procedure allows the ratio of the second order $A_2$ is deconstructed into a constant ratio, a linear ratio and a ratio of the second order, wherein the ratios are relative to a different coordinate system. The newly determined constant ratio and the newly determined ratio of the first order can be corrected (as was previously described). However, the functional dependency of the ratio of the second order $A_2$ is maintained. In both cases, a functional dependency results according to Equation 15. The correction of this functional dependency (insofar as it is possible) is also known from the aforementioned EP 0 850 422 B1.

In order to be able to make such a correction, the overlay system 6 has a system 13 of the second order in addition to the system 7 of the first order. The system 13 of the second order is fashioned such that fields $B_1$, $B_2$, $B_3$, $B_4$, $B_{4'}$, $B_{4''}$ can be generated by it that, to a first approximation, exhibit a spatial dependency of the second order. For this the system 13 of the second order normally has multiple sub-systems, subsequently designated as sub-systems 13a through 13d, 13d', 13d''.

In the operation of the magnetic resonance system according to the invention, the control device 8 as shown in to FIG. 2 receives a correction volume V (for example from a user 14) in Step S1. For example, the correction volume V can be a slice that is normally oriented relative to one of the axial directions x, y, z and exhibits a specific offset x', y' or z' along the corresponding axial direction x, y or z.

In Step S2, a weighting function W(x, y, z) is furthermore provided to the control device 8. The weighting function W can depend on the examination subject 5 and/or on the arrangement of the examination subject 5 in the examination volume 2.

The control device 8 determines the desired gradient G* in Step S3.

In Step S4, the control device 8 determines activation commands for the radio-frequency system 4, the individual sub-systems 7x, 7y, 7z of the system 7 of the first order and the sub-systems 13a through 13d, 13d', 13d'' of the system 13 of the second order. The control device 8 hereby determines the activation commands such that the deviation of the amplitude A of the complete field B from the desired amplitude B* satisfies a predetermined minimal condition within the correction volume V. For example, the activation commands can be determined such that the maximum or the average or a median value of the deviation is minimized. The desired amplitude B* is hereby defined by the basic magnetic field $B_0$ and the desired gradients $G_{x'}$.

In Step S5, the control device 8 controls the radio-frequency system 4, the system 7 of the first order and the system 13 of the second order corresponding to the determined activation commands. The correction of the error ratios must hereby ensue simultaneously with the application of the fields Bx, By, Bz of the first order only when the radio-frequency system 4 is also operated at this point in time. Otherwise the correction can alternatively ensue simultaneously or with a time offset.

In Step S6, the control device 8 checks whether a current measurement sequence has ended. Depending on the result of the check in Step S6, the control device 8 transitions either to Step S7 or to Step S8.

In Step S7, the control device 8 redetermines the desired gradient G*. It then returns to Step S4.

In Step S8, the control device 8 checks whether the operating method according to the invention should be ended. Depending on the result of the check in Step S8, the control device 8 returns to Step S1 or ends the further execution of the method.

For implementation of Step S4 of FIG. 2, the method advantageously proceeds as follows corresponding to FIG. 3:

In Step S11, the control device 8 identifies the individual sub-components of the ratio of the second order $A_2$. In the most general case, the ratio of the second order $A_2$ can be written as $$A_2 = a_1 x^2 + a_2 y^2 + a_3 z^2 + a_4 xz + a_5 yz \quad (18)$$

wherein the coefficients a1 through a5 are defined as $$a_1 = \alpha^2 G_z^2 / 2B_0 \quad (19\text{-}1)$$

$$a_2 = (1-\alpha)^2 G_z^2 / 2B_0 \quad (19\text{-}2)$$

$$a_3 = (G_x^2 + G_y^2) / 2B_0 \quad (19\text{-}3)$$

$$a_4 = -\alpha G_x G_z / B_0 \quad (19\text{-}4)$$

$$a_5 = -(1-\alpha) G_y G_z / B_0 \quad (19\text{-}5)$$

The first three terms of Equation (18) are quadratically dependent on a single one of the coordinates x, y, z and are therefore subsequently called quadratic ratios. The two latter cited terms of Equation (18) indicate a respective linear spatial dependency in two directions x and z or, respectively, y and z orthogonal to one another. Clearly these terms can only occur when both the sub-system 7z of the first order and one of the sub-systems 7x, 7y of the first order are operated simultaneously. They are subsequently designated as cross-ratios.

The coefficients a1, a2 and a3 are clearly zero at a minimum. The coefficients a4 and a5 can exhibit a positive or a negative algebraic sign. As already mentioned, they are unequal to zero when at least two of the sub-systems 7x, 7y, 7z of the system 7 of the first order are operated simultaneously.

As already mentioned, fields $B_1$ through $B_4$, $B_{4'}$, $B_{4''}$ which satisfy the Maxwell equations and, in a first approximation, exhibit a spatial dependency of the second order can be generated by means of the sub-systems 13a through 13d, 13d', 13d'' of the second order. For example, a field $B_1$ of the form $$b_1 xz \quad (20)$$

can be generated by means of the sub-system 13a. A field $B_2$ of the form $$b_2 yz \quad (21)$$

can be generated by means of the sub-system 13b. A field $B_3$ of the form $$b_3(x^2-y^2) \tag{22}$$

can be generated by means of the sub-system 13c. A field $B_4$ of the form $$b_4(z^2-\beta x^2-(1-\beta)y^2) \tag{23}$$

can be generated by means of the sub-system 13d. The generation of other fields of the second order is not possible since only the fields (or linear combinations of these fields) indicated above satisfy the Maxwell equations. Alternatively, it is possible that all or only a portion of the sub-systems 13a through 13d are present.

The factor $\beta$ in equation (23) is a design parameter. It lies between zero and one. It is therefore possible to provide multiple sub-systems of the type of sub-system 13d, wherein these sub-systems are designed such that the parameters $\beta$ of the individual sub-systems are different from one another. For example, two sub-systems 13d', 13d" can be present (as a replacement for the sub-system 13d) in which the parameter $\beta$ respectively exhibits the value zero and the value one. In this case, two fields $B_4'$, $B_4"$ can be generated according to the equations $$b_4'(z^2-x^2) \tag{24}$$

$$b_4"(z^2-y^2) \tag{25}$$

In the simplest case, only one of the sub-systems 7x, 7y, 7z of the first order is activated. As already mentioned repeatedly, in this case the coefficients $a_4$ and $a_5$ are zero. Furthermore, at least one of the coefficients $a_1$, $a_2$, $a_3$ is likewise zero.

The case that the sub-system 7z is activated is dealt with in the following purely as an example. In this case, the condition to be satisfied results as $$\int W(x,y,z)[a_1x^2+a_2y^2+b_3(x^2-y^2)+b_4'(z^2-y^2)]dV \to \text{Min} \tag{26}$$

Equation (26) can be reformulated as $$\int W(x,y,z)[(a_1+b_3-b_4')x^2+(a_2-b_3-b_4")y^2+(b_4'+b_4")z^2] \, dV \to \text{Min} \tag{27}$$

In Step S13, the control device 8 attempts to minimize the integral according to equation (27), for example by testing various values for the parameters $b_3$, $b_4'$, $b_4"$. In some cases, it is hereby unnecessary to find a solution that is better than $$b_3=b_4'=b_4"=0 \tag{28}$$

Depending on the correction volumes V and weighting functions W, however, it can be possible to produce such a minimization.

For example, it is assumed that the correction volumes V corresponds to a slice that runs orthogonal to the z-axis. Essentially, $z=z'$ thus applies within the correction volume V, wherein $z'$ is the offset in the z-direction. By contrast, the coordinates x and y are variable. In this case, a minimization is possible in that the factor is enabled at $z^2$, thus $b_4'+b_4"$. The coefficients of equation (27) are thus set to zero at $x^2$ and $y^2$ when $$b_4'+b_4"=a_1+a_2 \tag{29}$$

applies.

In spite of the activation of the system 13 of the second order, the amplitude A of the complete field B thus furthermore exhibits a spatial dependency of the second order. With regard to the coordinate z, the quadratic dependency had even been intensified. Nevertheless, a minimization is possible. Due to the fact that the condition $z=z'$ applies within the correction volume V, it is possible to compensate for this field offset via a correction of the zeroth order and/or a shift of the operating frequency f in connection with a correspondingly modified activation of the system 7 of the first order. The corresponding procedure is described in the aforementioned U.S. Pat. No. 6,515,478 B2.

Coefficients $b_3$, $b_4'$, $b_4"$ can be determined in an analogous manner when the correction volume V is a slice normal relative to the y-axis or normal relative to the x-axis.

From the above, it is furthermore clear that the cross-ratios (thus $a_4xz$ and $a_5xz$) can be completely corrected. It is then possible that the system 13 of the second order possesses the corresponding sub-systems 13a, 14b that exhibit the same functional dependency as the cross-ratios. It is thus possible to correspondingly determine the corresponding activations of the corresponding sub-systems 13a, 13b of the second order and to activate said corresponding sub-systems 13a, 13b corresponding to the activation of the corresponding sub-systems 7x, 7y of the first order.

According to equations (26) and (27), a weighting of the deviation of the amplitude A of the complete field B from the desired amplitude B* ensues with a spatially dependent weighting function W (x, y, z). According to the procedure according to the invention, a weighted deviation is thus used to check whether the minimum condition is satisfied.

Through the procedure according to the invention, it is thus possible to achieve an optimized minimization even with regard to the error contribution of the second order.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. A method for operating a magnetic resonance system, comprising the steps of:

in a magnetic resonance data acquisition unit, generating a static, spatially homogenous basic magnetic field in an examination volume of the magnetic resonance data acquisition unit;

inserting an examination subject in the examination volume and, with a radio-frequency system of said magnetic resonance data acquisition unit, irradiating the examination subject in the examination volume with radio-frequency energy to excite nuclear spins in the examination subject;

detecting magnetic resonance signals, arising in the examination subject as a result of the excitation of said nuclear spins, with said radio-frequency system;

with an overlay system of said magnetic resonance data acquisition unit, generating overlay fields in said examination volume that superimpose with said basic magnetic field to form a complete field;

configuring said overlay system as at least one first order field system and at least one second order field system;

with said first order field system, generating overlay fields that, to a first approximation, exhibit a spatial dependency of the first order;

with the second order field system, generating overlay fields that, to a first approximation, exhibit a spatial dependency of the second order;

through a control device of the magnetic resonance data acquisition unit, designating a desired gradient and a correction volume;

from said control device, operating said radio-frequency system with an operating frequency, and controlling said system of the first order and said system of the second order to cause a deviation of the amplitude of said complete field from a desired amplitude defined by the basic magnetic field and the desired gradient, to exhibit a spatial dependency of the second order and to satisfy a predetermined minimum condition within said correction volume; and with said control device, weighting a deviation of the amplitude of the complete field from the desired amplitude with a weighting function that is spatially dependent within the correction volume to check whether said minimum condition is satisfied.

2. A method as claimed in claim 1 comprising generating said weighting factor dependent on at least one of the examination subject and an arrangement of the examination subject in the examination volume.

3. A method as claimed in claim 1 comprising forming said system of the first order from multiple sub-systems that respectively generate overlay fields having a spatial dependency component parallel to said basic magnetic field, that defines orthogonal directions in pairs;

when at least two of said subsystems of the system of the first order are operated simultaneously, causing, via said control unit, the amplitude of the complete field to exhibit a cross-ratio exhibiting a linear spatial dependency in two of said orthogonal directions;

forming said system of the second order with at least one sub-system that generates an overlay field of the second order exhibiting a same functional dependency as said cross-ratio; and when said control device activates said at least two sub-systems of the first order simultaneously, also activating the sub-system of the system of the second order to entirely compensate for said cross-ratio with said system of the second order.

4. A non-transitory computer-readable medium encoded with programming instructions loadable into a control device of a magnetic resonance data acquisition unit, said programming instructions causing said control device to:

operate said magnetic resonance data acquisition unit to generate a static, spatially homogenous basic magnetic field in an examination volume of the magnetic resonance data acquisition unit;

after inserting an examination subject in the examination volume, operate a radio-frequency system of said magnetic resonance data acquisition unit to irradiate the examination subject in the examination volume with radio-frequency energy to excite nuclear spins in the examination subject;

operate said radio-frequency system to detect magnetic resonance signals arising in the examination subject as a result of the excitation of said nuclear spins;

operate an overlay system of said magnetic resonance data acquisition unit, formed from at least one system of the first order and at least one system of the second order to generate overlay fields in said examination volume that superimpose with said basic magnetic field to form a complete field by, with said system of the first order, generating overlay fields that, to a first approximation, exhibit a spatial dependency of the first order and, with the system of the second order, generating overlay fields that, to a first approximation, exhibit a spatial dependency of the second order;

allow designation of a desired gradient and a correction volume;

operate said radio-frequency system with an operating frequency, and control said system of the first order and said system of the second order to cause a deviation of the amplitude of said complete field from a desired amplitude defined by the basic magnetic field and the desired gradient, to exhibit a spatial dependency of the second order and to satisfy a predetermined minimum condition within said correction volume; and weight a deviation of the amplitude of the complete field from the desired amplitude with a weighting function that is spatially dependent within the correction volume to check whether said minimum condition is satisfied.

5. A control device for operating a magnetic resonance system, configured to:

operate said magnetic resonance data acquisition unit to generate a static, spatially homogenous basic magnetic field in an examination volume of the magnetic resonance data acquisition unit;

after inserting an examination subject in the examination volume, operate a radio-frequency system of said magnetic resonance data acquisition unit to irradiate the examination subject in the examination volume with radio-frequency energy to excite nuclear spins in the examination subject;

operate said radio-frequency system to detect magnetic resonance signals arising in the examination subject as a result of the excitation of said nuclear spins;

operate an overlay system of said magnetic resonance data acquisition unit, formed from at least one system of the first order and at least one system of the second order to generate overlay fields in said examination volume that superimpose with said basic magnetic field to form a complete field by, with said system of the first order, generating overlay fields that, to a first approximation, exhibit a spatial dependency of the first order and, with the system of the second order, generating overlay fields that, to a first approximation, exhibit a spatial dependency of the second order;

allow designation of a desired gradient and a correction volume;

operate said radio-frequency system with an operating frequency, and control said system of the first order and said system of the second order to cause a deviation of the amplitude of said complete field from a desired amplitude defined by the basic magnetic field and the desired gradient, to exhibit a spatial dependency of the second order and to satisfy a predetermined minimum condition within said correction volume; and weight a deviation of the amplitude of the complete field from the desired amplitude with a weighting function that is spatially dependent within the correction volume to check whether said minimum condition is satisfied.

6. A magnetic resonance system comprising:

a magnetic resonance data acquisition unit that generates a static, spatially homogenous basic magnetic field in an examination volume of the magnetic resonance data acquisition unit;

a patient bed configured to insert an examination subject in the examination volume and;

a radio-frequency system of said magnetic resonance data acquisition unit that irradiates the examination subject in the examination volume with radio-frequency energy to excite nuclear spins in the examination subject and that detects magnetic resonance signals, arising in the examination subject as a result of the excitation of said nuclear spins, with said radio-frequency system;

an overlay system of said magnetic resonance data acquisition unit that generates overlay fields in said examination volume that superimpose with said basic magnetic field to form a complete field;

said overlay system being formed by at least one system of the first order and at least one system of the second order;

said system of the first order being configured to generate overlay fields that, to a first approximation, exhibit a spatial dependency of the first order;

said system of the second order being configured to generate overlay fields that, to a first approximation, exhibit a spatial dependency of the second order;

a control device of the magnetic resonance data acquisition unit through which a desired gradient and a correction volume are designated;

said control device being configured to operate said radio-frequency system with an operating frequency, and to control said system of the first order and said system of the second order to cause a deviation of the amplitude of said complete field from a desired amplitude defined by the basic magnetic field and the desired gradient, to exhibit a spatial dependency of the second order and to satisfy a predetermined minimum condition within said correction volume; and said control device being configured to weight a deviation of the amplitude of the complete field from the desired amplitude with a weighting function that is spatially dependent within the correction volume to check whether said minimum condition is satisfied.

* * * * *